(12) United States Patent
Koga

(10) Patent No.: US 6,693,309 B2
(45) Date of Patent: Feb. 17, 2004

(54) MASK ROM AND METHOD FOR MANUFACTURING THE SAME

(75) Inventor: Hitomi Koga, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/161,650

(22) Filed: Jun. 5, 2002

(65) Prior Publication Data

US 2002/0187620 A1 Dec. 12, 2002

(30) Foreign Application Priority Data

Jun. 12, 2001 (JP) ...................................... 2001-176535

(51) Int. Cl.$^7$ .............................................. H01L 29/73
(52) U.S. Cl. ........................ 257/104; 257/208; 257/202
(58) Field of Search ................................ 438/174, 276, 438/279; 257/104, 202, 203, 208, 50, 209

(56) References Cited

U.S. PATENT DOCUMENTS 6,215,725 B1 * 4/2001 Komatsu ..................... 365/233
6,440,803 B1 * 8/2002 Huang et al. ............... 438/276

FOREIGN PATENT DOCUMENTS

JP  6-5079 A  1/1994

\* cited by examiner

*Primary Examiner*—Caridad Everhart
(74) *Attorney, Agent, or Firm*—Sughrue Mion, PLLC

(57) ABSTRACT

A mask ROM and a method for manufacturing such a mask ROM are provided. Here, the mask ROM can be effective to obtain a product that corresponds to each user's specification, where the same aluminum reticle is used even though each user uses different specification. For manufacturing the mask ROM, one of a first route and a second route is selected. The first route is for providing a second NAND circuit 26 with an input of a pulse obtained by passing a standard pulse 93 from an address transition detecting circuit through a first delay circuit 23 and an input of a fixed potential. The second route is for providing a fist NAND circuit 25 with an input of pulse obtained by passing a standard pulse from an address transition detecting circuit through a first delay circuit, an inverter, and a second delay circuit 22 and an input of fixed potential, and for providing the second NAND circuit with an input of an output from the first NAND circuit and an input of a pulse obtained by passing a standard pulse from the address transition detecting circuit through the first delay circuit.

4 Claims, 11 Drawing Sheets

(SCHEMATIC DIAGRAM OF EACH PULSE TIMING)

MASK ROM AND METHOD FOR MANUFACTURING THE SAME

BACKGROUND OF THE INVENTION

1: Field of the Invention

The present Invention relates to a mask ROM and a method for manufacturing the mask ROM. More specifically, the present invention relates to a mask ROM in which spec (specification) can be switched to another spec on the basis of each ROM code by means of ion implantation.

2: Description of the Related Art

Each of the conventional mask ROMs is one of a semiconductor memory device, where data storage is performed by means of ion implantation in channel regions of transistors selected from a plurality of insulated gate transistors being arranged in a matrix form on a memory region by ROM code data which varies from one user to another. In addition, most of the conventional mask ROMs employ the following system.

In this system, that is, data is read out by generating internal control pulses from a delay circuit on the basis of standard pulses (reference pulses) generated from an ATD circuit (Address Transition Detecting circuit), for example as disclosed in Japanese Patent Application Laying-open No. 6-5079 (1994), formed on a region of a semiconductor substrate other than the memory region.

Hereinafter, we will describe the conventional mask ROM with reference to FIG. 1 to FIG. 3.

In FIG. 1, an ATD circuit system 90 comprised of a plurality of ATD circuits (Address Transition Detecting circuits) 91 receive each address signal 92 to generate a standard pulse 93.

Subsequently, a delay circuit system 80 receives the standard pulse 93 and also receives a signal 95 from a WCR circuit 94 that changes the width of a signal using the capacity of a transistor. Then the delay circuit system 80 generates an internal control signal pulse 81. The internal control signal 81 is used for controlling the operations of a SA (sense amp) circuit, an output circuit, and so on.

In the conventional mask ROM as shown in FIG. 1, however, the operation spec thereof is defined only by the standard pulse from the ATD circuit and the internal control signal pulse is then defined by such an ATD circuit. Therefore, the changing or relaxation of a selection spec does not correspond to the changing of the operation spec.

FIG. 2 is a flow chart for illustrating a method for manufacturing the conventional mask ROM. In this method, channel regions of transistors are selected using ROM code data which varies from one user to another. Then, an ion implantation is performed on such channel regions to control the threshold of the transistor to store DATA. After the step of data storage, the same post-process (the same aluminum wring process) is performed.

A user A requires ROM code data A and requires an internal control signal pulse for data rate (the speed at which data is generated) signal of 100 NS.

A user B requires ROM code data B and requires an internal control signal pulse for data rate (the speed at which data is generated) signal of 130 NS.

A mask ROM to be delivered to the user A forms a code reticle (reticle mask) for obtaining ROM code data A and performs ion implantation on channel regions of a group of transistors among a plurality of transistors being arranged in a matrix form on a memory region to alter the thresholds of these transistors.

A mask ROM to be delivered to the user B forms a code reticle for obtaining ROM code data B and performs ion implantation on channel regions of a group of transistors among a plurality of transistors being arranged in a matrix form on a memory region to alter the thresholds of these transistors.

Subsequently, the same aluminum wiring pattern is used for the wiring of each of the mask ROM to be delivered to the user A and the mask ROM to be delivered to the user B. In other words, wiring patterns of the respective mask ROMs are formed using the same aluminum reticle.

Then, both mask ROMs in FIG. 2 are constructed so as to obtain the same internal control signals from the circuit shown in FIG. 1.

In this case, the fabrication of each mask ROM should be conformity to 100 NS of one having a rate faster than another.

Consequently, each of the mask ROMs has the same internal control signal pulse, so that 100 NS products can be obtained regardless of same or different specs.

In some cases, however, the user B wants a 130 NS product having a data flow slower than that of 100 NS. Thus, the above pulse determination is strict with the user B who wants have a wider variety of specs to choose from.

Alternatively, as shown in FIG. 3, there is another method for manufacturing a conventional mask ROM comprising the different post-processes. In this method, a channel region of a transistor is selected using ROM code data which varies from one user to another. Then, an ion implantation is performed on such a channel to change the threshold of the transistor to store DATA. After the step of data storage, the different aluminum wring processes are performed for the respective users.

That is, in spite of using the same internal control signal pulse, the mask ROM to be delivered to the user A forms a wiring pattern using an aluminum reticle corresponding to spec of 100 NS and the mask ROM to be delivered to the user B forms a wiring pattern using an aluminum reticle corresponding to spec of 130 NS.

The aluminum reticle can be changed as described above, so that an appropriate aluminum reticle can be used depending on the need of the user. The product corresponding to each user, i.e., the product corresponding to the user B who may accept a slow data rate, is formed using its aluminum pattern. The production yields can be improved even though severe pulse setting can be applied. An appropriate post-process is individually applied on each user, so that the desired product can be satisfactory obtained.

In the conventional method shown in FIG. 3, however, a different aluminum reticle must be required for each user, so that the productivity is inevitably decreased by the increase of the number of different steps and the additional step for producing a different kind of the aluminum reticle.

Therefore, in the conventional method shown in FIG. 2, strict specifications are forced to any product that only require relaxed specifications, resulting -in the reduced yields.

In the conventional method shown in FIG. 3, on the other hand, at the time of performing an aluminum wiring after storing different ROM code data for each user's application, a different aluminum reticle must be required for each user's specifications, resulting in the reduced yields.

SUMMARY OF THE INVENTION

Therefore, an object of the present invention is to provide an effective mask ROM and a method for manufacturing such a mask ROM, where the resulting mask ROM allows the use of the same aluminum reticle for forming aluminum wiring pattern and also allows the fabrication of a product that corresponds to the specifications for each user even though ROM code data varies depending on the application being desired by the user and the specifications vary depending on the user.

A first aspect of the present invention is to provide a mask ROM where selective introduction of impurities is performed on a memory region, preferably a channel region of transistor in the memory region, formed on a semiconductor substrate on the basis of ROM code data supplied from a user, comprising: a specification switching means formed on a region of the semiconductor substrate other than the memory region, wherein the specification switching means is operative for selecting a specification by selective introduction of impurities on the basis of information about the specification supplied from the user.

Preferably, here, the mask ROM may further comprise a circuit for generating an internal control pulse by passing a standard pulse from an address transition detecting circuit through a delay circuit, so that a route for generating the internal control pulse from the standard pulse is changed using the specification switching means. In this case, the mask ROM may be further comprise: a first delay circuit, a second delay circuit, an inverter, a first NAND circuit, and second NAND circuit; a first route for providing the second NAND circuit with an input of a pulse obtained by passing a standard pulse from the address transition detecting circuit through the first delay circuit and an input of a fixed potential; and a second route for providing the first NAND circuit with an input of pulse obtained by passing a standard pulse from the address transition detecting circuit through the first delay circuit, the inverter, and the second delay circuit and an input of fixed potential, and for providing the second NAND circuit with an input of an output from the first NAND circuit and an input of a pulse obtained by passing a standard pulse from the address transition detecting circuit through the first delay circuit, wherein one of the first route and the second route is selected by the specification switching means.

Alternatively, the mask ROM may preferably further comprise a circuit for generating an internal control pulse by passing a standard pulse from the address transition detecting circuit through the delay pulse, so that the specification switching means is the change in the amount of delay in the delay circuit. In this case, the delay circuit may comprise a plurality of transistors to be provided as capacity elements, so that the amount of delay in the delay circuit can be defined by performing ion implantation on channel regions of the selected transistors.

In another aspect of the present invention is to provide a method for manufacturing a mask ROM, comprising the steps of: preparing a reticle mask that meats ROM code data and spec information provided from a user; performing ion implantation corresponding to the spec information on a semiconductor substrate when the ion implantation is selectively performed on the semiconductor substrate on the basis of the ROM code data.

Here, the ion injection depending on the ROM code data and the ion injection depending on the spec information may be preferably performed on a channel region of insulated gate field effect transistor.

Furthermore, the method may further comprise the step of wiring formation, which is performed after the step of ion implantation, or alternatively further comprise the step of wiring formation, which is performed before the step of ion implantation.

DETAILED DESCRIPTION OF PREFERRED EMBODIMENTS

Figure 4A:
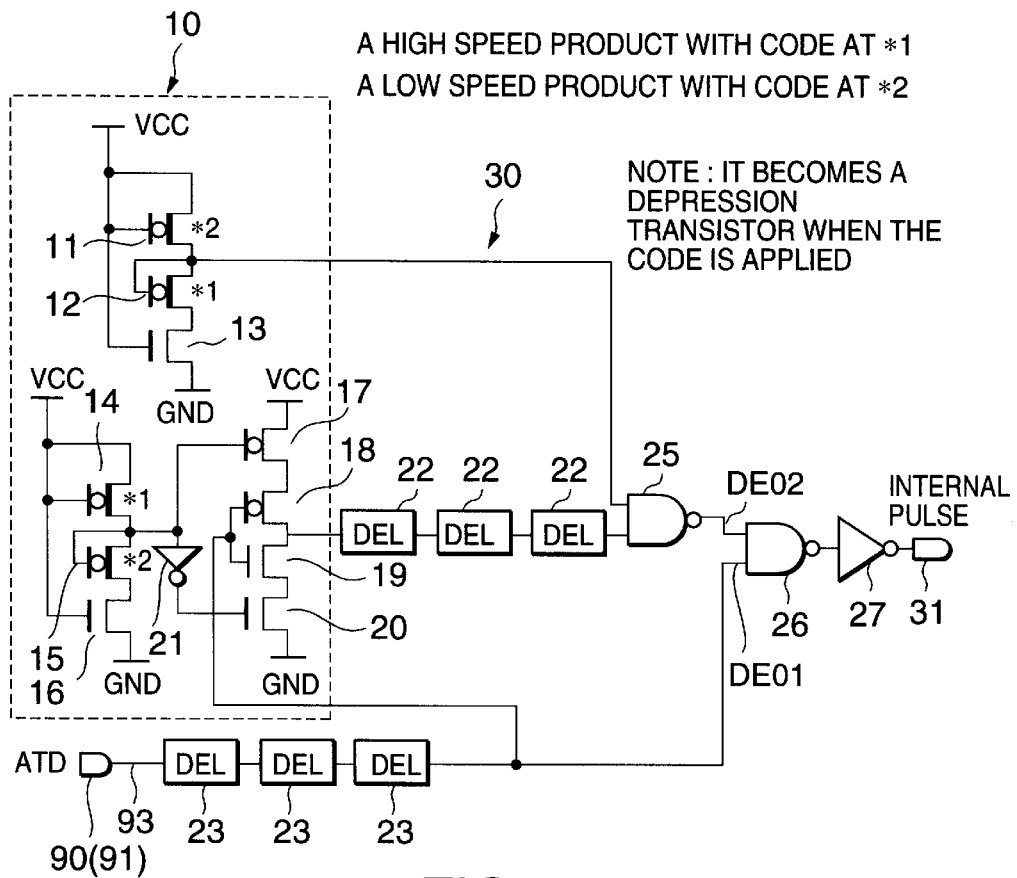
FIG. 4A is a circuit diagram that illustrates a circuit for obtaining an internal control pulse in accordance with a preferred embodiment of the present invention.
Figure 4B:
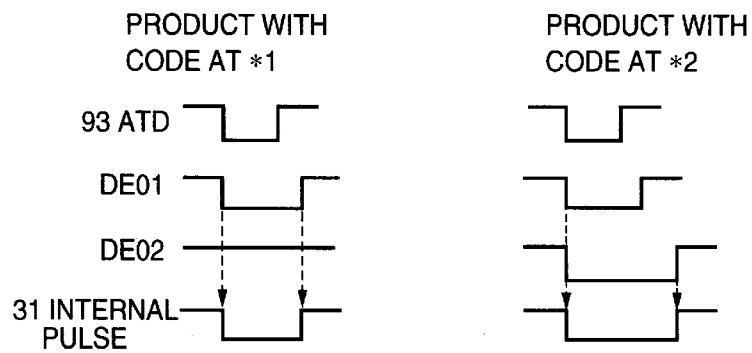
FIG. 4B is a waveform to be obtained by the circuit shown in FIG. 4A.
Figure 5A:
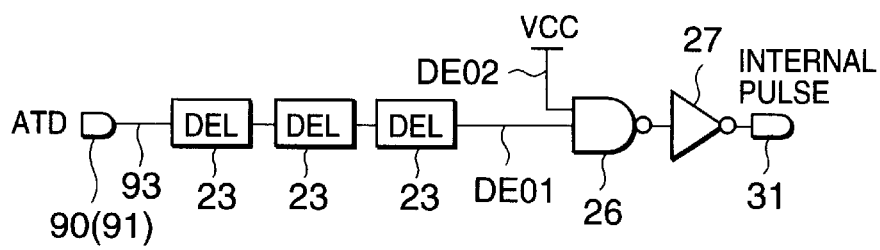
FIG. 5A is a circuit diagram corresponding to the circuit shown in FIG. 4A, where a mask ROM with a high data rate (100 NS) is used.
Figure 5B:
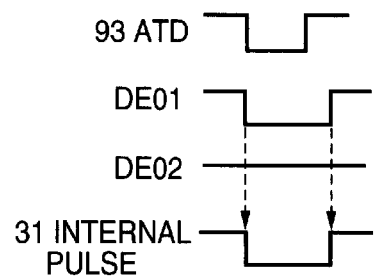
FIG. 5B is a waveform to be obtained by the circuit shown in FIG. 5A.
Figure 6A:
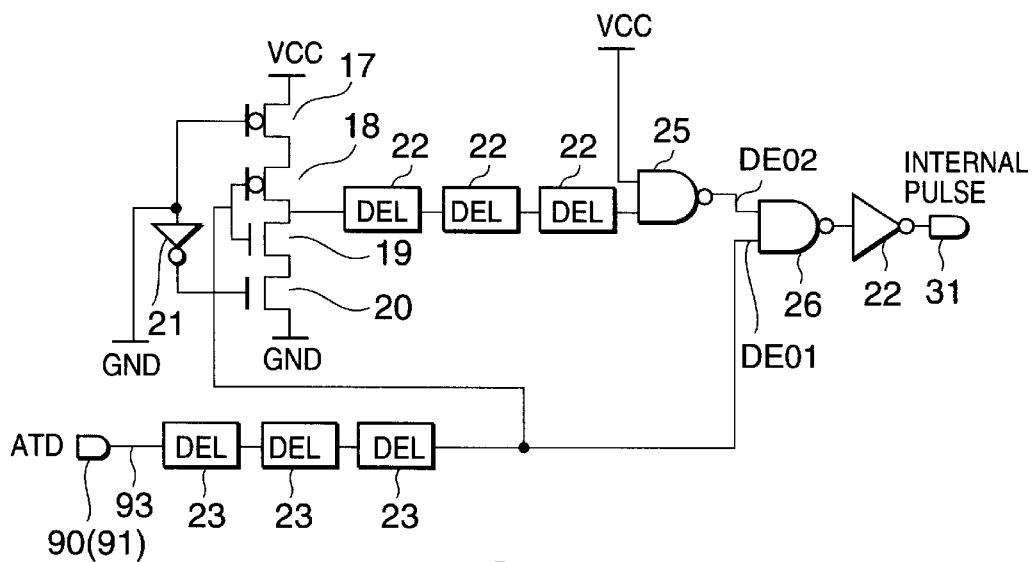
FIG. 6A is a circuit diagram corresponding to the circuit shown in FIG. 4A, where a mask ROM with a low data rate (130 NS) is used.
Figure 6B:
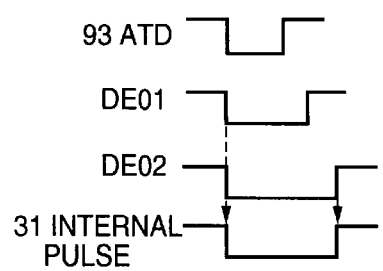
FIG. 6B is a waveform to be obtained by the circuit shown in FIG. 6A.
Figure 7:
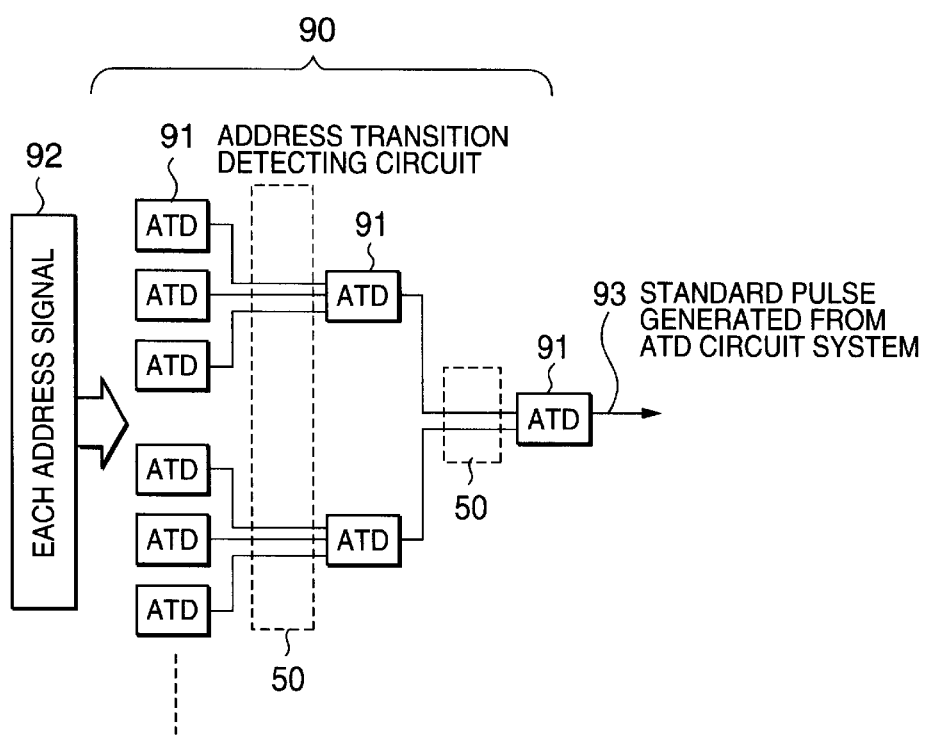
FIG. 7 is a block diagram that illustrates an ATD circuit system comprising a plurality of ATD circuits.

Hereinafter, we will describe preferred embodiments of the present invention with reference to the attached drawings. FIG. 4A is a circuit diagram for obtaining an internal control signal pulse in accordance with a first preferred embodiment of the present invention, and FIG. 4B is a waveform to be obtained from the circuit shown in FIG. 4B. FIG. 5A is a circuit diagram for mask ROM that allows a high data rate (100 NS) in FIG. 4, and FIG. 5B is a waveform to be obtained from the circuit shown in FIG. 5A. FIG. 6A is a circuit diagram for mask ROM that allows a low data rate (130 NS) in FIG. 4, and FIG. 6B is a waveform to be obtained from the circuit shown in FIG. 6A. Furthermore, FIG. 7 is an ATD circuit system to be used in the present embodiment.

As shown in FIG. 4A, at first, a circuit for obtaining an internal control signal pulse according the present embodiment comprises a specification-selective circuit system 10 and a delay circuit system 30.

The specification-selective circuit system 10 featured of the present invention comprises: a serial body (inverter) including a P-type field-effect transistor (hereinafter, referred to as PMOST) 11, PMOST 12, and a N-type field-effect transistor (hereinafter, referred to as NMOST) 13 between VCC and GND; a serial body (inverter) including PMOST 14, PMOST15, and NMOST 16 between VCC and GND; a serial body (inverter) including PMOST 17, PMOST 18, NMOST 19, and NMOST 20; and an inverter 21 connected between a gate of NMOST 20 and a connection node between PMOSTs 14, 15 and a gate of PMOST 17.

The delay circuit system 30 comprises: a serial body of a plurality of delay circuits 22 (in the figure, three delay circuits); a serial body of a plurality of delay circuits 23 (in the figure, three delay circuits) for the input of a standard pulse 93 from an ATD circuit system 90; a first NAND circuit 25, a second NAND circuit 26 for the inputs of a first input signal (DE01) and a second input signal (DE02); and inverter 27.

Figure 1:
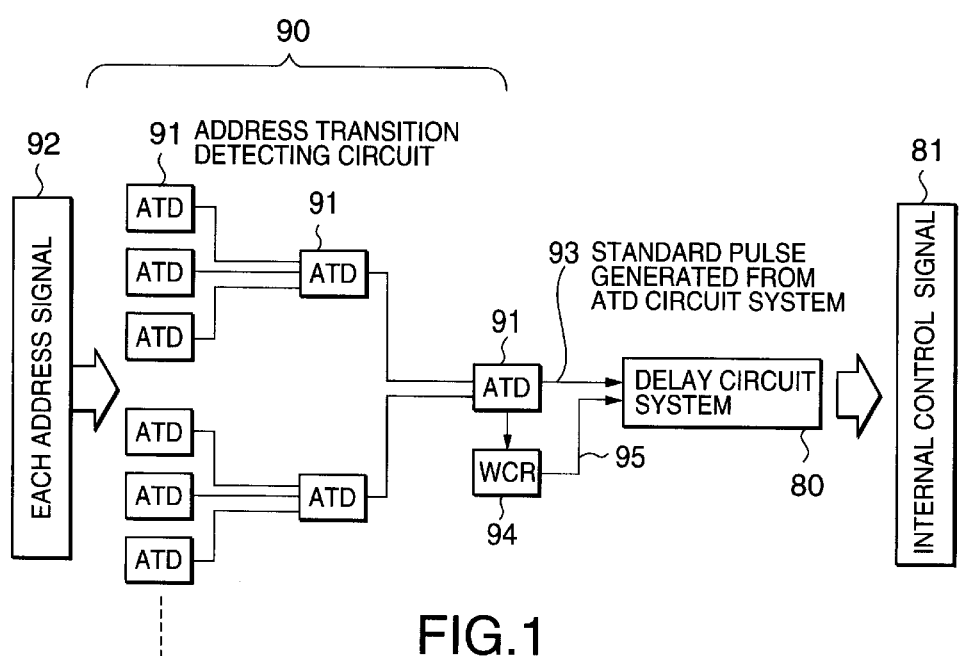
FIG. 1 is a block diagram that illustrates a circuit of the prior art in which an internal control signal can be generated.
Figure 2:
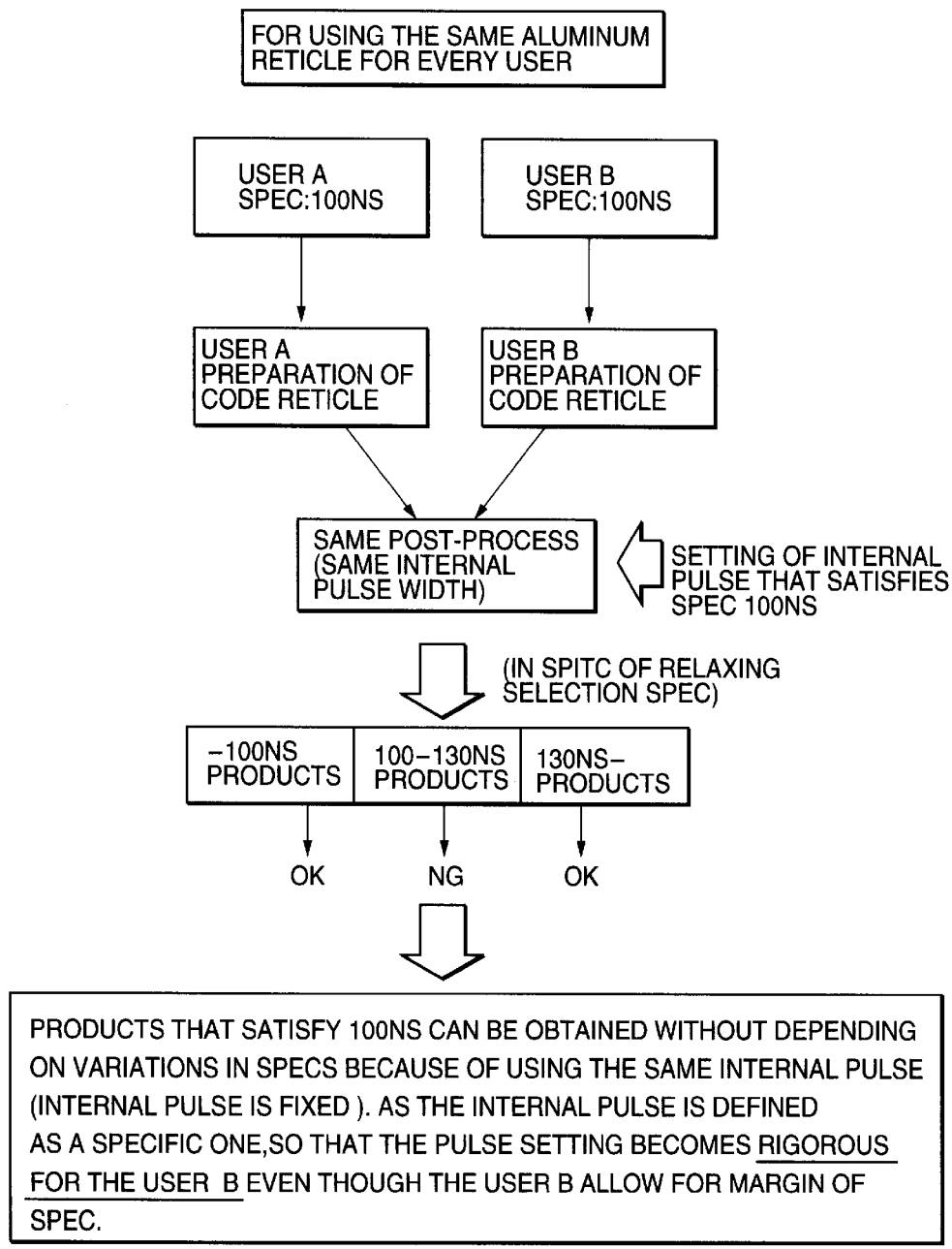
FIG. 2 is a flow chart that illustrates the conventional method for manufacturing mask ROM.

Referring now to FIG. 7, as well as FIG. 1, an ATD circuit system 90 for generating a standard pulse 93 by receiving each address signal 92 comprises a plurality of ATD (Address Transition Detection) circuits 91.

Next, the operation of FIG. 4 will be described.

The user A requires ROM code data A and probably requires a product having a comparatively higher data rate (speed at which data is generated and output), for example one having an internal control signal pulse that allows a data rate of 100 NS.

On the other hand, the user B requires ROM code data B and probably requires a product having a comparatively lower data rate, for example one having an internal control signal pulse that allows a data rate of 130 NS.

At the time of receiving an order from the user A, a reticle for obtaining ROM code data A is prepared. As shown in FIG. 12, ion implantation is performed on the respective channel regions of a group of NMOSTs among a plurality of NMOSTs being arranged in a matrix form on a memory region to convert these NMOSTs into high VT (high threshold) transistors.

Figure 12A:
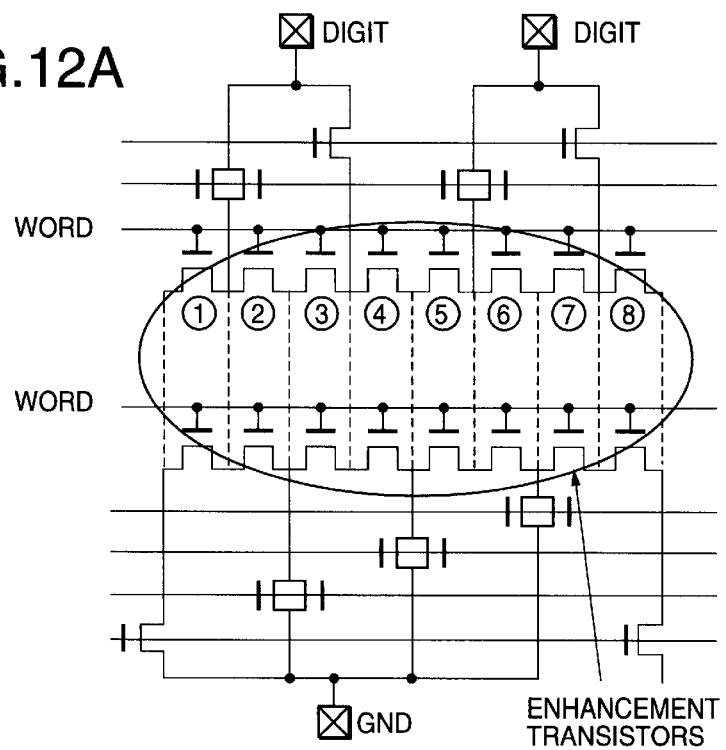
FIG. 12A is a circuit diagram that illustrates a memory region.
Figure 12B:
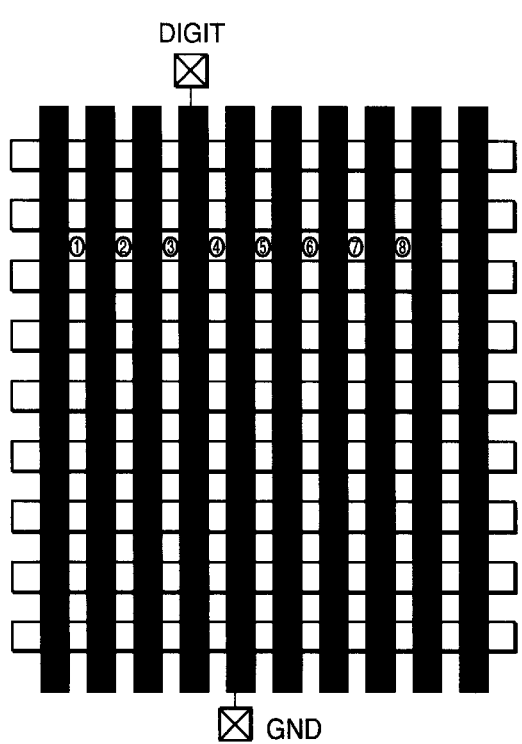
FIG. 12B is a plane diagram of the circuit shown in FIG. 12A.

Here, the memory region will be described with reference to FIGS. 12A and 12B. FIG. 12A is a circuit diagram of the memory region and FIG. 12B is a plane diagram of the memory region. Memory cells in the memory region of the mask ROM product employ code switching mechanisms by ion implantation, respectively, generally for attaining a small-area and large-capacity. Therefore, as will be described below, the number of steps cannot be increased even though any circuit for ion implantation as shown in FIG. 4 or the like is used, so that the code-switching with ion implantation will become effective.

At this time, in the same ion-implantation step, ion implantation is performed, in FIG. 4, on channel regions of PMOSTs 12, 14 among enhancement-type PMOSTs 11, 12, 14, 15 at the beginning in the specification-selective circuit system 10 formed in a region other than the memory region of the same semiconductor substrate. Consequently, these PMOSTs 12, 14 are converted into depression-type PMOSTs, while leaving PMOSTs 11, 15 in enhancement-type. In FIG. 4, it is represented as a high-speed product with a code at *1.

Next, we will describe a circuit and a signal waveform by performing ion implantation on channel regions of PMOSTs 12, 14 so as to meet specifications for high data rate at the time of receiving an order from the user A (i.e., in the case of striking codes on PMOSTs 12, 14, respectively).

In this case, among PMOST 11, PMOST 12, and NMOST 13 in the serial body of the specification-selective circuit system 10 shown in FIG. 4, the depression-typed PMOST 12 and the NMOST 13 with the gate connecting to VCC line are always in an ON state, so that one input of the first NAND circuit 25 is always at an L level, while its output, i.e., one input DE02 of the second NAND circuit 26 is always at an H level (VCC), resulting in the circuit shown in FIG. 5A.

Therefore, the waveform of the inner control pulse 31 in such a state is determined by the other input DE01 of the second NAND circuit 26 as an output of the serial body of a plurality of the delay circuit (DEL) 23 (in the figure, three delay circuits) that inputs the standard pulse 93. Such a waveform becomes one having a narrow pulse width as shown in the left chart of FIG. 4B and FIG. 5B, so that it can be associated with a high-speed mask ROM that generates an output at a high-speed.

Next, at the time of receiving an order from the user B, a reticle for obtaining ROM code data B is prepared. Then, ion implantation is performed on the respective channel regions of a group of NMOSTs among a plurality of NMOSTs being arranged in a matrix form on a memory region to convert these NMOSTs into high VT transistors.

At this time, in the same ion-implantation step, ion implantation is performed on channel regions of PMOSTs 11, 15 among enhancement-type PMOSTs 11, 12, 14, 15 at the beginning in the specification-selective circuit system 10 of FIG. 4. Consequently, these PMOSTs 11, 15 are converted into depression-type PMOSTs, while leaving PMOSTs 12, 14 in enhancement-type. In FIG. 4, it is represented as a low-speed product with a code at *2.

Next, we will describe a circuit and a signal waveform by performing ion implantation on channel regions of PMOSTs 11, 15 so as to meet specifications for low data rate at the time of receiving an order from the user B (i.e., in the case of striking codes on PMOSTs 11, 15, respectively).

In this case, in the specification-selective circuit system 10 of FIG. 4, PMOST 11 is always in an ON state and PMOST 12 is always in an OFF state. Therefore, one input of the first NAND 25 is always at an H level (VCC).

In addition, in the specification-selective circuit system 10 of FIG. 4, PMOST 14 becomes OFF, PMOST 15 becomes ON, and NMOST 16 becomes ON. Therefore, from these transistors and the inverter 21, PMOST 17 and NMOST 20 become ON, respectively, while a common gate of the PMOST 18 and NMOST 19 in the middle receive the input of a standard pulse 93 from the ATD circuit system 90 through the serial body of a plurality of delay circuits (DEL) 23 (in the figure, three DELs).

A pulse from an output node of the drain-drain connection between PMOST 18 and NMOST 19 in the middle is provided as the other input of the first NAND circuit 25 through the serial body of a plurality of delay circuits (DEL) 22 (in the figure, three DELS).

Then, the output of the first NAND circuit 25 becomes one input DE02 of the second NAND circuit 26, a pulse which is a standard pulse 93 from the ATD circuit 90 passed through the serial body of a plurality of delay circuits (DEL) 23 (in the figure, three DELs) becomes the other input DE01 of the second NAND circuit 26. Subsequently, an output thereof passes through the inverter 27, resulting in an internal control signal pulse 31 to provide a circuit shown in FIG. 6A.

Therefore, the wavelength of the internal control pulse 31 in this state is defined by an input pulse DE01 of the second NAND circuit 26 as an output from a plurality of delay circuits (DEL) 23 (in the figure, three DELs) and an input pulse DE02 of the second NAND circuit 26 obtained through the serial body of a plurality of delay circuits (DEL) 22 (in the figure, three DELs) and the first NAND circuit 25. By the plurality of delay circuits (DEL) 22 (in the figure, three DELs), such a waveform becomes one having a wide pulse width as shown in the right chart of FIG. 4B and FIG. 6B, so that it can be associated with a mask ROM that generates an output at a low-speed.

Figure 8:
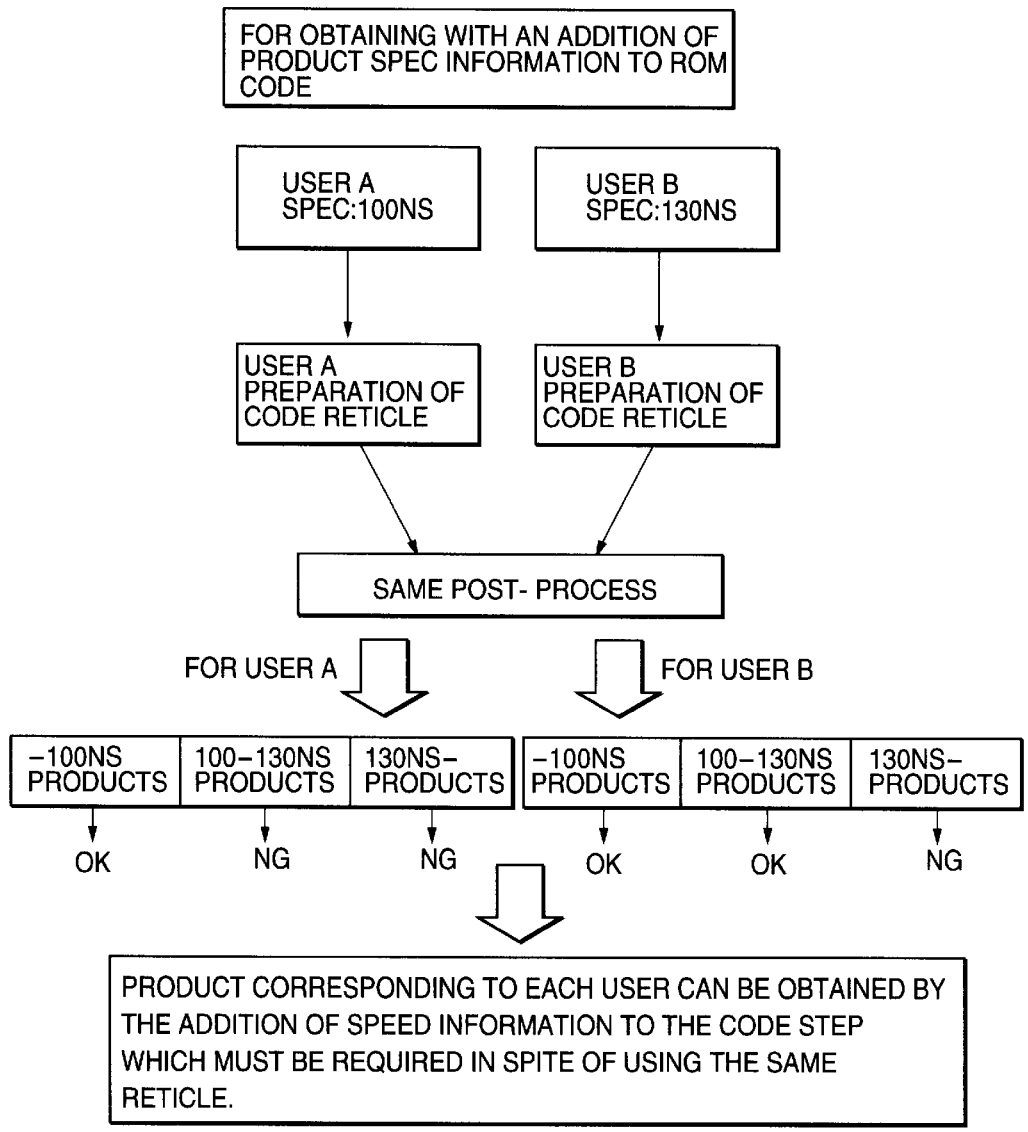
FIG. 8 is a flow chart that illustrates the fabrication of a mask ROM in accordance with the preferred embodiment of the present invention.

FIG. 8 is a fabrication flow chart in accordance with the present embodiment. ROM code is obtained together with production specifications (required data rate). That is, the information that requires an internal control signal pulse by which ROM code data A and data rate become those of 100 NS is obtained from the user A, while the information that requires an internal control signal pulse by which ROM code data B and data rate become those of 130 NS is obtained from the user B.

For the user A, a code reticle A is prepared. The code reticle A is responsible for performing ion implantation in channel regions of a group of transistors selected from transistors being arranged in a matrix form in a memory region and converting them into high VT transistors. Further, this code reticle A performs ion implantation in channel regions of selected from transistors in the specification-selective circuit system of FIG. 4 and these selected transistors are then converted into depression-type transistors, so that there is provided a pattern that provides an inner control signal pulse for providing a data rate with 100 NS.

Then, the code reticle A is masked and ion implantation are then performed on the memory region and the specification-selective circuit system on other region to simultaneously form ROM code data A and a circuit element for obtaining a narrow internal control signal pulse.

For the user B, a code reticle B is prepared. The code reticle B is responsible for performing ion implantation in channel regions of a group of transistors selected from transistors being arranged in a matrix form in a memory region and converting them into high VT transistors. Further, this code reticle B performs ion implantation in channel regions of selected from transistors in the specification-selective circuit system of FIG. 4 and these selected transistors are then converted into depression-type transistors, so that there is provided a pattern that provides an inner control signal pulse for providing a data rate with 130 NS.

Then, the code reticle B is masked and ion implantation are then performed on the memory region and the specification-selective circuit system on other region to simultaneously form ROM code data B and a circuit element for obtaining a wide internal control signal pulse.

After that, the same aluminum wiring patterns are formed by using the same aluminum reticle for manufacturing both of half-finished products for the user A and user B, respectively.

Therefore, in spite of using the same aluminum reticle and the same wiring patterns, mask ROMs appropriately corresponding to the respective specifications can be obtained.

Figure 3:
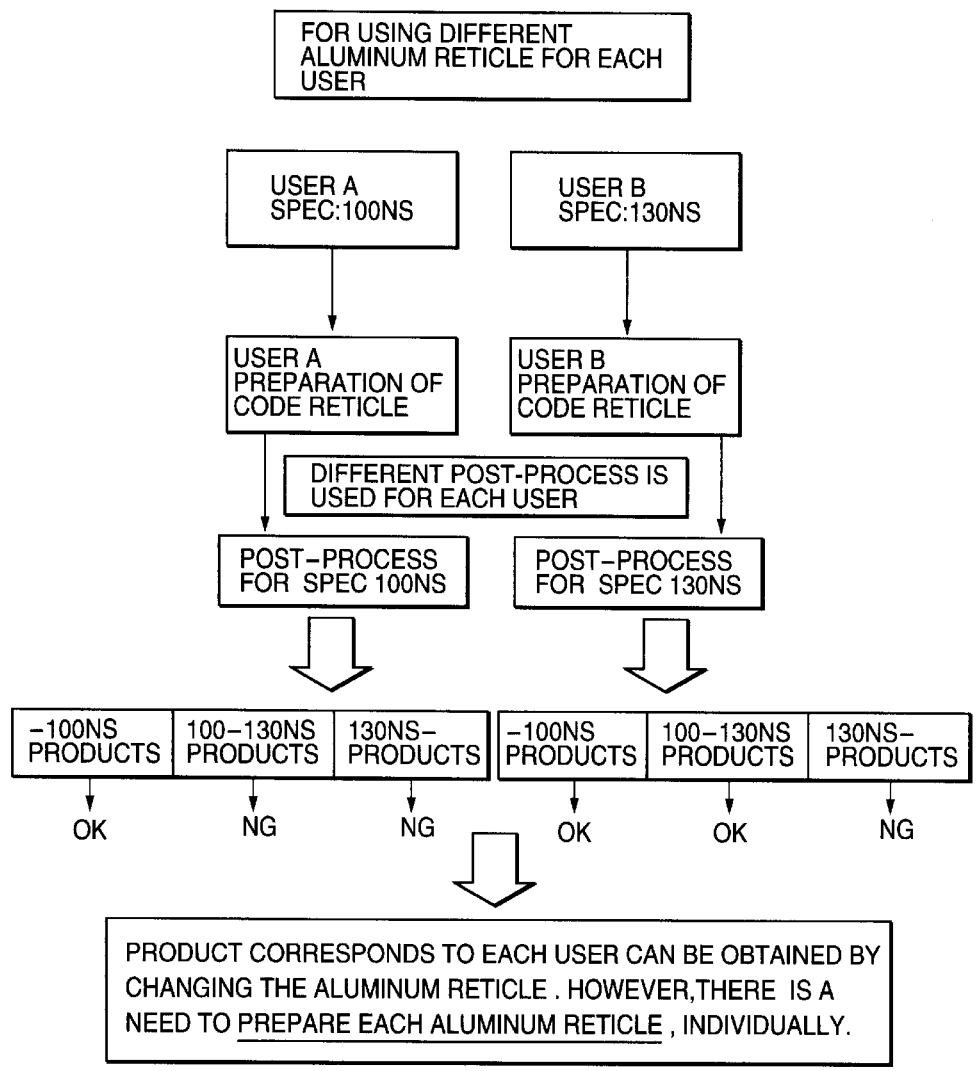
FIG. 3 is a flow chart that illustrates another conventional method for manufacturing mask ROM.

According the present embodiment shown in FIG. 8, although the same wiring patterns are used for both of user A and user B, the same estimation results as FIG. 3 can be obtained.

That is, in FIG. 8, for the user A, products which are 100 NS or faster than 100 NS are estimated as good (OK): products which are slower than 100 NS, and 130 NS or faster than 130 NS are estimated as defective (NG): and, products which are slower than 130 NS are estimated as defective (NG).

On the other hand, for the user B, products which are 100 NS or faster than 100 NS are estimated as good (OK): products which are slower than 100 NS, and 130 NS or faster than 130 NS are estimated as good (OK): and, products which are slower than 130 NS are estimated as defective (NG).

Figure 9:
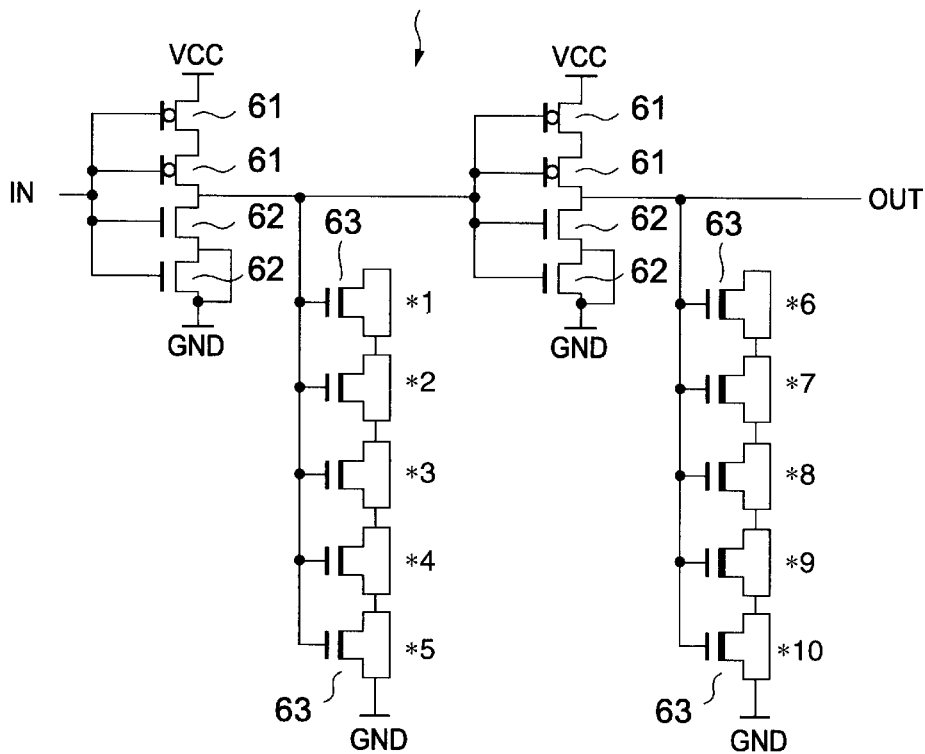
FIG. 9 is a circuit diagram that illustrates a circuit for obtaining an internal control pulse in accordance with another preferred embodiment of the present invention.

FIG. 9 is a circuit diagram that illustrates another preferred embodiment of the present invention, where the amount of delay in the delay circuit is used for the correspondence to each specification. That is, the amount of each delay circuit (DEL) 22 or 23 in the specification-selective circuit system 10 in FIG. 4 is adjusted by ion injection so as to be fit to the user's specifications without selectively depressing the transistors in the system 10.

In the configuration of the delay circuit (DEL) 22 or 23 in FIG. 9, two inverter each composed of PMOSTs 61, 61 and NMOSTs 62, 62 are arranged between an input terminal (IN) and an output terminal (OUT) of the delay circuit for shifting a rising edge and a break of a pulse in time.

Each of two serial bodies respectively comprising a plurality of NMOSTs 63 (five NMOSTs for each in the figure) is a transistor capacity body. The amount of delay in the delay circuit is determined by adjusting the capacity value to provide an internal control pulse with a predetermined width for obtaining a mask ROM appropriate to specifications with respect to the user's data rate.

In the foregoing embodiment, the wiring was performed by the step of using aluminum wiring after the step of ion implantation to obtain a predetermined ROM code and a predetermined internal control pulse.

In this embodiment, after performing the step of aluminum-wiring, the ion-implantation step may be performed for obtaining the predetermined ROM code and the predetermined internal control pulse.

At the time of completing the step of aluminum-wiring, the parameter measurements are performed. The resulting parameters allow the determination of parameter values of the product.

Then, the ion implantation is performed on a channel region of NMOST 63 as much as the capacity value to make a high VT transistor. As a result, an appropriate capacity value of the transistor can be determined.

As shown in FIG. 9, for example, if it is desired to reduce the delay value so as to be less than that of the normal case in which the capacity value corresponds to five transistors, the amount of delay is adjusted such that the ion implantation is performed so as to correspond to the capacity value for the amount of delay desired to be reduced.

Accordingly, it makes possible to determine the amount of delay by the step of ion implantation to get the desired ROM code.

If there are variations in VTs (thresholds), the delay is determined after the measurements on parameters of the actual product, so that it becomes possible to produce a better product.

In each of the embodiments described above, it has been explained about the ion implantation into the selected transistors in which the writings of ROM code data in the memory region and the pulse widths of internal control signals were changed. Also, in the configuration of the memory cell shown in FIG. 12, the high VT transistors are formed by ion implantation. Alternatively, the depression transistors may be formed by ion implantation depending on another configuration of the memory cell. In this case, it is possible to implement by substituting NMOSTs for PMOSTs 11, 12, 14 and 15 in FIG. 4.

Figure 10:
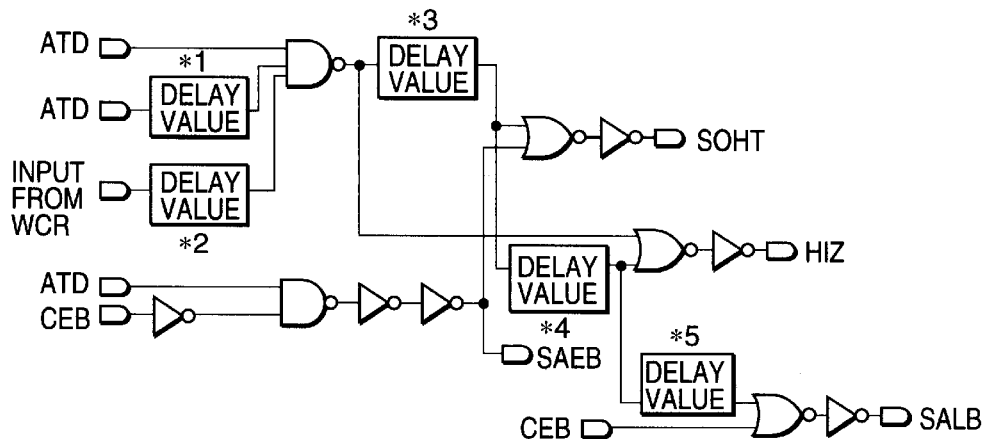
FIG. 10 is a circuit diagram that illustrates the example of how the embodiment of the present invention is used.
Figure 11:
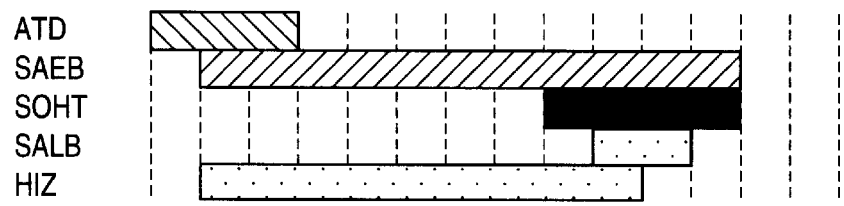
FIG. 11 is a schematic diagram that illustrates pulse settings in FIG. 10.

FIG. 10 is a circuit diagram that illustrates an example how the embodiment of the present invention is used and FIG. 11 shows the pulse settings for the circuit shown in FIG. 10.

In FIG. 10, "delay values"*1 to *5 mean the respective delay values obtained in the circuit of FIG. 4 or FIG. 9 including the specification-selective circuit system 10. A SOHT signal is a signal to be introduced into a sense amp circuit and is prepared from a signal transmitted from ATD.

It is conceivable that there is no sense margin at the time of causing the undesired VCC MIN or the like. In such a case, the delay value *3 is defined such that the SOHT signal pulse can be prolonged. In other words, the SOHT pulse can be prolonged by code if any circuit capable of changing the delay value by code as shown in FIG. 4 is used as a portion indicated as "delay value *3" in FIG. 10.

At this time, if it is not desired to alter the production specifications, the pulses corresponding to the delay values *4, *5 are adjusted to shorter widths to generate appropriate internal signals that satisfy the product pulse.

Furthermore, conversely, if the VCC MAX is insufficient, it is conceivable that there is no latch margin. In this case, it becomes necessary to adjust the pulse of SALB signal to be provided as an input of a latch circuit. At this time, as described above, the SALB pulse can be prolonged by code if any circuit capable of changing the delay value by code as shown in FIG. 4 is used as a portion indicated as "delay value *5" in FIG. 10.

At this time, if it is not desired to alter the production specifications, the pulses corresponding to the delay values *3, *4 are adjusted to shorter widths to generate appropriate internal signals that satisfy the product pulse.

It is possible to determine how to set each signal pulse by feedback from the information about parent product or the like and it is also possible to set the pulse by code on the basis of such information.

In FIG. 10, furthermore, a signal from WCR is a signal in which the width of an ATD signal is changed by the transistor capacity, and CEB, SAEB and HIZ are signals which activate a sense amp and control output signal.

Next, we will describe the generation of skew (difference) in an ATD signal from each address in the case of using the ATD circuit.

If a skew is caused on signal lines in a portion 50 surrounded by a dotted line in FIG. 7, there is a possibility of causing a deviation from the desired ATD pulse.

The skew value of each ATD is calculated by simulation to avoid any undesired trouble to be caused by skew. In this case, as shown in the specification-selective circuit system 10 of FIG. 4 or FIG. 9, a depression transistor which can be switched by code is previously arranged in the ATD circuit system to allow the change in transistor capacity. Therefore, it becomes possible to take measures to skew using the code.

In addition, if there is a user who requests specific specifications or the like, it is possible that the code is compatible with such specifications. For example, if there is a user who requests a speed up by narrowing the temperature range, the delay value for attaining a desired speed in the predetermined temperature range is determined by simulation. Therefore, it becomes possible to switch the delay path of the user at the normal specifications using the delay circuit shown in FIG. 4 and the delay path of the user who indicates the specific specifications by code. In this case, furthermore, it can be realized by the typical process except that the request of normal specifications from the user and the request of specific specifications from the user are switched using the normal code.

Furthermore, among the products which seem to be called standard products, there are products having the same construction except their operating voltages. For example, there are 5-volt products and 3-volt products in those having the same construction.

In this case, if the delay value depending on each voltage is defined in advance, each product corresponding to each operating voltage can be prepared by only changing the passage of delay with code. Therefore, for example, 5-volt products and 3-volt products can be prepared using only different codes in the stream like a general process.

According to the present invention, therefore, a mask ROM appropriate to the specifications for each user can be obtained by means of wiring using the same reticle even though ROM code data is specific for each application of mask ROM for the user and the different specifications are desired for each user.

Therefore, there is no need to prepare each reticle in the wiring process, so that the costs of reticle preparation can be reduced.

In addition, a pulse width of an internal control signal can be easily changed such that it fits to each desired specification. Therefore, there is no need to use strict specifications. As a result, the production yields can be improved to about 5% up.

In addition, the writing of ROM code data in the memory region and the change of the pulse width of internal control signal are also performed by the selective introduction of impurities, while there is no need to change the wiring pattern. Therefore, the overall integration can be improved.

Furthermore, the writing of ROM code data in the memory region and the change of the pulse width of internal control signal are simultaneously performed by the selective introduction of impurities, so that the productivity can be increased while the period from the customer's order to delivery can be shortened.

Furthermore, there is a possibility of applying the present invention to specific specifications (voltage range, temperature range, and so on). It is possible to change the delay value without the need of input from the outside or the like. Also, it is possible to correspond to each user specification only by normal post-process without using test mode or the like. Therefore, it can be used in actual product.

What is claimed is:

1. A mask ROM where selective introduction of impurities is performed on a memory region formed on a semiconductor substrate on the basis of ROM code data supplied from a user, comprising:
   a specification circuit formed on the semiconductor substrate, wherein
      the specification circuit is operative for selecting a specification by selective introduction of impurities on the basis of information about the specification supplied from the user, further comprising:
      a circuit for generating an internal control pulse by passing a standard pulse from an address transition detecting circuit through a delay circuit, wherein a route for generating the internal control pulse from the standard pulse is changed using the specification circuit.

2. A mask ROM where selective introduction of impurities is performed on a memory region formed on a semiconductor substrate on the basis of ROM code data supplied from a user, comprising:

a specification circuit formed on the semiconductor substrate, wherein
the specification circuit is operative for selecting a specification by selective introduction of impurities on the basis of information about the specification supplied from the user, further comprising:
a first delay circuit, a second delay circuit, an inverter, a first NAND circuit, and second NAND circuit;
a first route for providing the second NAND circuit with an input of a pulse obtained by passing a standard pulse from the address transition detecting circuit through the first delay circuit and an input of a fixed potential; and
a second route for providing the first NAND circuit with an input of pulse obtained by passing a standard pulse from the address transition detecting circuit through the first delay circuit, the inverter, and the second delay circuit and an input of fixed potential, and for providing the second NAND circuit with an input of an output from the first NAND circuit and an input of a pulse obtained by passing a standard pulse from the address transition detecting circuit through the first delay circuit, wherein
one of the first route and the second route is selected by the specification circuit.

3. A mask ROM where selective introduction of impurities is performed on a memory region formed on a semiconductor substrate on the basis of ROM code data supplied from a user, comprising:

a specification circuit formed on the semiconductor substrate, wherein
the specification circuit is operative for selecting a specification by selective introduction of impurities on the basis of information about the specification supplied from the user, further comprising:
a circuit for generating an internal control pulse by passing a standard pulse from the address transition detecting circuit through the delay pulse, wherein
the specification circuit is the change in the amount of delay in the delay circuit.

4. A mask ROM as claimed in claim 3, wherein
the delay circuit comprises a plurality of transistors to be provided as capacity elements, wherein
the amount of delay in the delay circuit is defined by introduction of impurities into the selected transistors.

* * * * *